United States Patent
Balakrishnan et al.

(10) Patent No.: US 7,215,105 B2
(45) Date of Patent: *May 8, 2007

(54) METHOD AND APPARATUS FOR MAINTAINING A CONSTANT LOAD CURRENT WITH LINE VOLTAGE IN A SWITCH MODE POWER SUPPLY

(75) Inventors: Balu Balakrishnan, Saratoga, CA (US); Alex B. Djenguerian, Saratoga, CA (US); Kent Wong, Fremont, CA (US); David Michael Hugh Matthews, Sunnyvale, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/397,524

(22) Filed: Apr. 3, 2006

(65) Prior Publication Data

US 2006/0176716 A1    Aug. 10, 2006

Related U.S. Application Data

(63) Continuation of application No. 10/892,300, filed on Jul. 15, 2004, which is a continuation of application No. 10/253,307, filed on Sep. 23, 2002, now Pat. No. 6,781,357.

(60) Provisional application No. 60/325,642, filed on Sep. 27, 2001.

(51) Int. Cl.
*G05F 1/40* (2006.01)
(52) U.S. Cl. .................. 323/282; 323/235; 363/97
(58) Field of Classification Search ........ 323/282–288, 323/235, 224, 313, 315; 363/75, 80, 89, 363/49–56

See application file for complete search history.

(56) References Cited

U.S. PATENT DOCUMENTS 4,371,824 A    2/1983    Gritter (Continued)

FOREIGN PATENT DOCUMENTS

EP    0744818 A1    11/1996

OTHER PUBLICATIONS

Infineon Technologies Preliminary Datasheet, "ICE2AS01; Off-Line SMPS Current Mode Controller," Datasheet, Version 2.1, Feb. 2001, Infineon Technologies AG, München, Germany.

(Continued)

*Primary Examiner*—Rajnikant B. Patel
(74) *Attorney, Agent, or Firm*—Blakely Sokoloff Taylor & Zafman, LLP

(57) ABSTRACT

A power supply including a regulation circuit that maintains an approximately constant load current with line voltage. An example circuit includes a switch including first, second and third terminals. The first terminal is coupled or decoupled to the second terminal in response to a control signal received at the third terminal. Voltage sense circuitry is included and is coupled to sense a voltage drop across the switch. The voltage drop is representative of a current in the switch during an on time of the switch. The voltage sense circuitry has a variable current limit threshold that increases between a first level and a second level during the on time of the switch. The control signal is responsive to the variable current limit threshold to regulate a power supply with an output characteristic having an approximately constant output voltage below an output current threshold and an approximately constant output current below an output voltage threshold.

5 Claims, 5 Drawing Sheets

U.S. PATENT DOCUMENTS

| | | |
|---|---|---|
| 4,392,103 A | 7/1983 | O'Sullivan et al. |
| 4,674,020 A | 6/1987 | Hill |
| 5,014,178 A | 5/1991 | Balakrishnan |
| 5,045,800 A | 9/1991 | Kung |
| 5,268,631 A | 12/1993 | Gorman et al. |
| 5,285,366 A | 2/1994 | Zaretsky |
| 5,313,381 A | 5/1994 | Balakrishnan |
| 5,479,090 A | 12/1995 | Schultz |
| 5,680,034 A * | 10/1997 | Redl ................. 363/21.03 |
| 6,154,377 A | 11/2000 | Balakrishnan et al. |
| 6,166,521 A | 12/2000 | Mercer et al. |
| 6,226,190 B1 | 5/2001 | Balakrishnan et al. |
| 6,297,623 B1 | 10/2001 | Balakrishnan et al. |
| 6,525,514 B1 | 2/2003 | Balakrishnan et al. |
| 6,580,593 B2 | 6/2003 | Balakrishnan |
| 6,665,197 B2 | 12/2003 | Gong et al. |
| 6,747,443 B2 | 6/2004 | Balakrishnan et al. |
| 6,781,357 B2 | 8/2004 | Balakrishnan et al. |
| 6,833,692 B2 | 12/2004 | Balakrishnan et al. |

OTHER PUBLICATIONS

National Semiconductor: Linear and Switching Voltage Regulator Fundamentals, 'Online: XP002316042 Retrieved from the Internet: URL: http://web.archive.org/web/20010602192453/http://www.national.com/appinfo/powerfiles/f4.pdf>.

European Search Report, EP 02256760, Feb. 2, 2005.

* cited by examiner

METHOD AND APPARATUS FOR MAINTAINING A CONSTANT LOAD CURRENT WITH LINE VOLTAGE IN A SWITCH MODE POWER SUPPLY

REFERENCE TO PRIOR APPLICATION

This application is a continuation of U.S. application Ser. No. 10/892,300, filed Jul. 15, 2004, now pending, which is a continuation of U.S. application Ser. No. 10/253,307, filed Sep. 23, 2002, now U.S. Pat. No. 6,781,357 B2, which claims the benefit of and priority to U.S. provisional application serial No. 60/325,642, filed Sep. 27, 2001, entitled "Method And Apparatus For Maintaining A Constant Load Current With Line Voltage In A Switch Mode Power Supply."

BACKGROUND OF THE INVENTION

1. Field of the Invention

This invention relates generally to power supplies and, more specifically, the present invention relates to a switched mode power supply.

2. Background Information

All electronic devices use power to operate. A form of power supply that is highly efficient and at the same time provides acceptable output regulation to supply power to electronic devices or other loads is the switched-mode power supply. In many electronic device applications, especially the low power off-line adapter/charger market, during the normal operating load range of the power supply an approximately constant output voltage is required below an output current threshold. The current output is generally regulated below an output voltage in this region of approximately constant output voltage, hereafter referred to as the output voltage threshold.

In known switched mode power supplies without secondary current sensing circuitry, minimizing the variation of the output current at the output voltage threshold is performed with complex control schemes. Typically, these schemes include the measurement of input voltage, output diode conduction time and peak primary current limit. Some or all of this measured information is then used to control the regulator in order to reduce the variation of the output current at the output voltage threshold.

SUMMARY OF THE INVENTION

A power supply that maintains an approximately constant load current with line voltage below the output voltage threshold is disclosed. In one embodiment, a regulation circuit includes a semiconductor switch and current sense circuitry to sense the current in the semiconductor switch. The current sense circuitry has a current limit threshold. The regulation circuit current limit threshold is varied from a first level to a second level during the time when the semiconductor switch is on. In one embodiment, the regulation circuit is used in a power supply having an output characteristic having an approximately constant output voltage below an output current threshold and an approximately constant output current below an output voltage threshold. In another embodiment, a power supply is described, which includes a power supply input and a power supply output and that maintains an approximately constant load current with line voltage below the output voltage threshold. In one embodiment, the power supply has an output characteristic having an approximately constant output voltage below an output current threshold and an approximately constant output current below an output voltage threshold. A regulation circuit is coupled between the power supply input and the power supply output. The regulation circuit includes a semiconductor switch and current sense circuitry to sense the current in the semiconductor switch. The current sense circuitry has a current limit threshold. The regulation circuit current limit threshold is varied from a first level to a second level during the time when the semiconductor switch is on. In another aspect, the current limit threshold being reached coincides with the power supply output characteristic transitioning from providing an approximately constant output voltage to supplying an approximately constant output current. In yet another aspect, the semiconductor switch is a MOSFET. Additional features and benefits of the present invention will become apparent from the detailed description and figures set forth below.

BRIEF DESCRIPTION OF THE DRAWINGS

The present invention detailed illustrated by way of example and not limitation in the accompanying figures.

DETAILED DESCRIPTION

Figure 1:
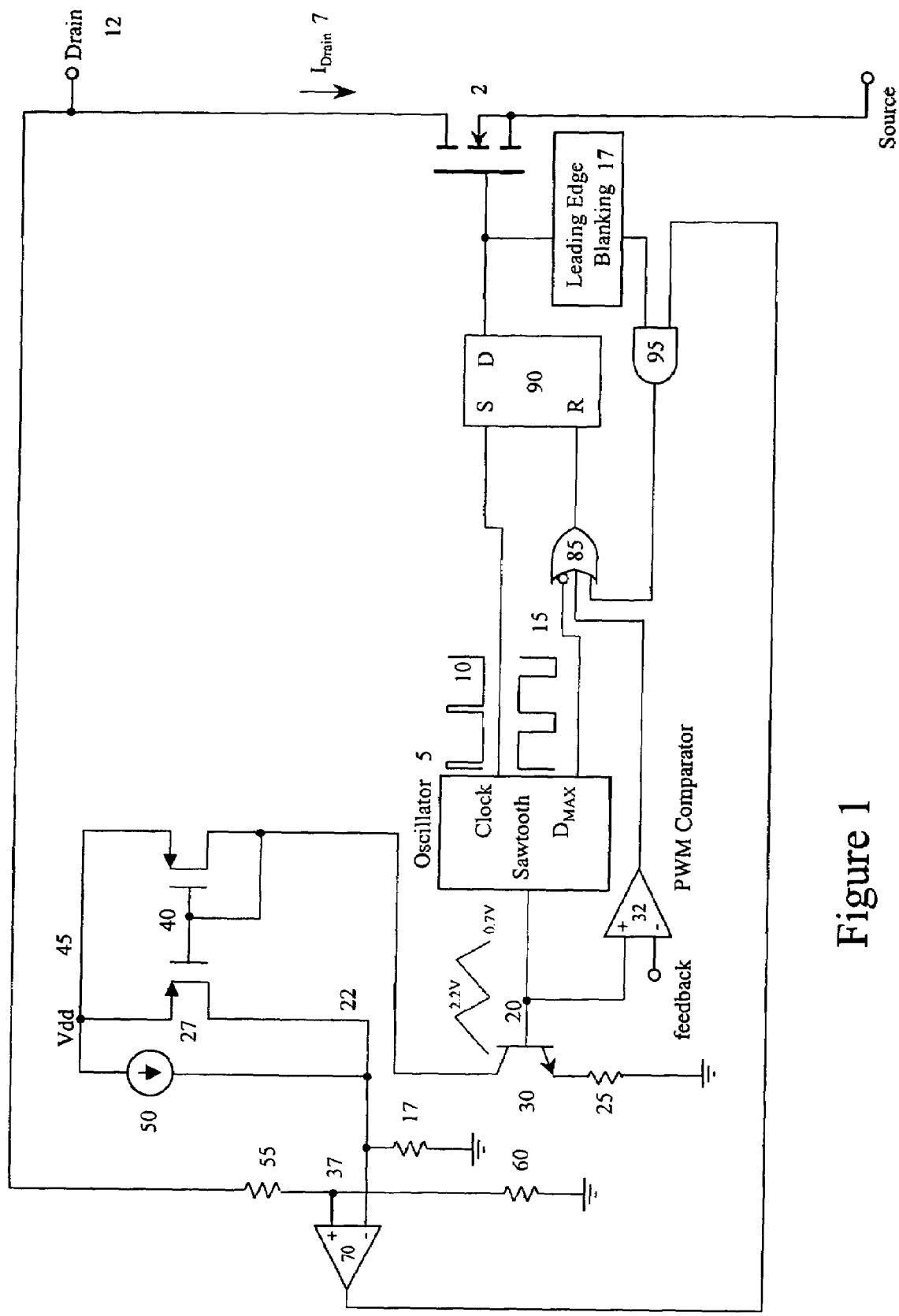
FIG. 1 is a schematic of one embodiment of a switched mode power supply regulator in accordance with the teachings of the present invention.

Embodiments of methods and apparatuses for maintaining a power supply output current substantially constant independent of input voltage at the point where the power supply output characteristic transitions from providing an approximately constant output voltage to supplying an approximately constant output current are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

In one embodiment here, a switched mode power supply is described in which the output current below the output voltage threshold, is regulated to be approximately constant. This provides an approximate constant voltage/constant current output characteristic. The output current level at the output voltage threshold in known power supplies sensed at the output of the power supply to provide feedback to a regulator circuit coupled to the primary winding of the power supply. If however, the approximate constant current functionality is achieved without feedback from the secondary winding side of the power supply, the output current at the output voltage threshold is a function of a peak current limit of the primary regulator.

Embodiments of the present invention reduce the variation of the output current at the output voltage threshold by reducing the peak current limit variation with changing input voltage. In general, the intrinsic peak current limit is set by internal circuitry in the regulator to be constant. In one embodiment, once the drain current reaches a current limit threshold, the switching cycle should, in theory, terminate immediately. However, a fixed delay is inherent from the time the threshold is reached until the power metal oxide semiconductor field effect transistor (MOSFET) is finally disabled. During this delay, the drain current continues to ramp up at a rate equal to the direct current (DC) input voltage divided by the primary inductance of the transformer (drain current ramp rate). Therefore, the actual current limit is the sum of the intrinsic current limit threshold and a ramp-rate dependent component (the overshoot), which is the drain current ramp rate multiplied by the fixed delay. Thus, at higher DC input voltages, the actual current limit ramps to a higher level above the intrinsic current limit level than at low DC input voltages. This can result in variations in the output current delivered to the load at the output voltage threshold over a range of input line voltages.

The actual current limit is the sum of the intrinsic current limit and the ramp-rate dependent component (the overshoot). The goal is to maintain a constant actual current limit over DC input voltage variations. Since the ramp-rate component (the overshoot) increases with respect to the DC input voltage, the only way to maintain a relatively constant current limit would be to reduce the intrinsic current limit threshold when the DC input voltage rises.

In discontinuous power supply designs, the point in time during the switching cycle in which the current limit is reached is dependent on the DC input voltage. In fact, the time it takes from the beginning of the cycle to the point where current limit is inversely proportional to the DC input voltage. Thus, the time elapsed from the beginning of the cycle can be used to gauge the DC input voltage.

Therefore, in order to create an intrinsic current limit which decreases relative to the DC input voltage, the time elapsed can be used. It is simply necessary to increase the intrinsic current limit as a function of the time elapsed during the cycle. A first approximation for increasing the intrinsic current limit with time can be obtained by using the Equation 1 below:

$$I_{LIM\text{-}INTRINSIC} = K_1 + K_2 * t_{elapsed},\quad\text{(Equation 1)}$$

where is $I_{LIM\text{-}INTRINSIC}$ the intrinsic current limit, $K_1$ and $K_2$ are constants and $t_{elapsed}$ is the time elapsed.

In one embodiment, the time elapsed can be detected by the internal oscillator output waveform. In one embodiment, this waveform is a triangular one. It starts at its minimum at the beginning of the cycle. It gradually ramps until it reaches the point of maximum duty cycle.

In one embodiment, he ramp is substantially linear with time. In another embodiment, the ramp can also be nonlinear depending on the requirements of the power supply in which the regulator is used. The intrinsic current limit threshold is basically proportional to the voltage seen at the input of the current limit comparator. This bias voltage is the product of the resistor value and the current delivered to this resistor. One way to increase the intrinsic current limit linearly as a function of the elapsed time would then be to derive a linearly increasing (with elapsed time) current source and deliver this current to the resistor. This linearly increasing (with elapsed time) current source can thus be derived from the oscillator.

FIG. 1 shows a schematic of one embodiment of a switched mode power supply in accordance with the teachings of the present invention. All of the circuitry shown in this schematic is used to control the switching of the power MOSFET 2. The timing of the switching is controlled by oscillator 5. Oscillator 5 generates three signals: Clock 10, DMAX (Maximum duty cycle) 15, and Sawtooth 20. The rising edge of Clock signal 10 determines the beginning of the switching cycle. As shown in the illustrated embodiment, when Clock signal 10 is high, output latch 90 is set, which results in a control signal output from output latch 90 to enable power MOSFET 2 to begin conducting. The maximum conducting time is determined by DMAX 15 signal being high. When DMAX 15 signal goes low, latch 90 is reset, thus causing the control signal output from latch 90 to disable power MOSFET 2 from conducting.

The intrinsic current limit is, to the first order proportional to the voltage on node 22. As stated earlier, the goal of the invention is to generate an intrinsic current limit proportional to the time elapsed in the switching cycle. The saw tooth waveform 20 can be used to perform this task. As the base voltage of NPN transistor 30 rises, the emitter voltage also rises at the same rate. Thus, the current through resistor 25 is linearly increasing with time elapsed during the switching cycle. After mirroring this current through current mirror 40, the linearly increasing (with elapsed time) current source 27 is derived. The current limit threshold 22 is thus proportional to the product of the combination of linearly increasing current source 27 and constant current source 50 with the resistor 17. The voltage on node 37 is proportional to the power MOSFET drain voltage because of the voltage divider network formed by resistors 55 and 60. The drain current is proportional to the drain voltage. As the drain current 7 ramps up during the switching cycle, the voltage on node 37 rises proportionately. After the voltage on node 37 exceeds the voltage on current limit threshold node 22, comparator 70 disables the power MOSFET by ultimately resetting latch 90.

PWM Comparator 32 modulates the duty cycle based on the feedback signal coming from the output of the power supply. The higher the feedback voltage, the higher the duty cycle will be.

Figure 2:
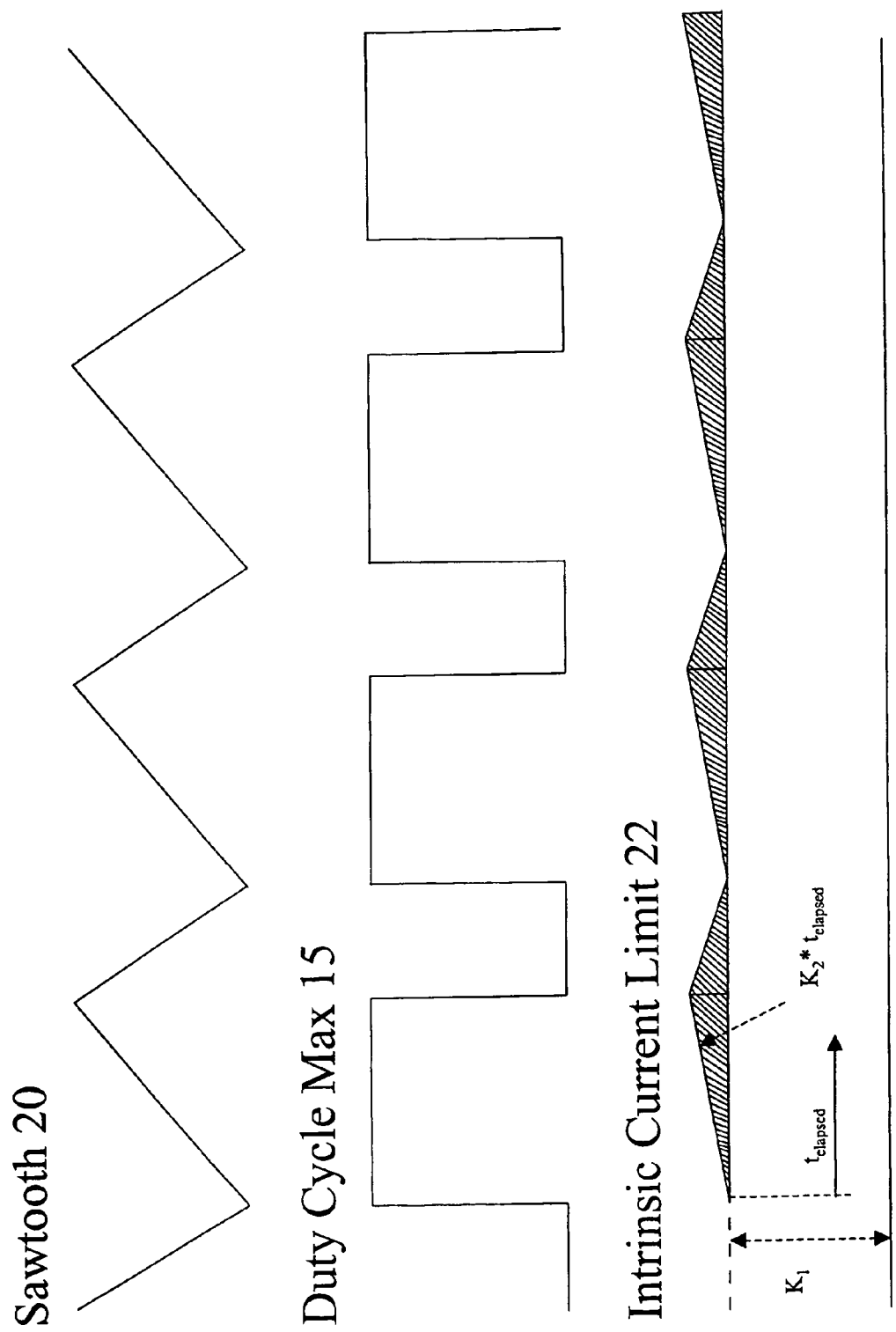
FIG. 2 is a diagram illustrating one embodiment of sawtooth, duty cycle and intrinsic current limit waveforms in accordance with the teachings of the present invention.

FIG. 2 shows an embodiment of three waveforms: sawtooth 20, duty cycle max 15, and intrinsic current limit 22. The sawtooth waveform 20 and the duty cycle max waveform 15 are generated by the oscillator 5. The duty cycle max 15 signal determines the maximum duration of a power MOSFET switching cycle, when it is high. The sawtooth waveform 20 starts increasing at the low point when the duty cycle max waveform 15 goes high. This signals the beginning of the power MOSFET switching cycle. The high point of the sawtooth 20 is reached at the end of the cycle, at the same time the duty cycle max signal 15 goes low. The intrinsic current limit 22 signal starts at the low point at the beginning of the cycle and then linearly increases with elapsed time throughout the cycle. At a time elapsed of zero, the intrinsic current limit is at $K_1$. As time elapsed increases, the current limit increases by a factor of $K_2 * t_{elapsed}$. As can be seen in FIG. 2 therefore, the intrinsic current limit ($I_{LIM-INTRINSIC}$) is the sum of $K_1$ and $K_2 * t_{elapsed}$.

Figure 3:
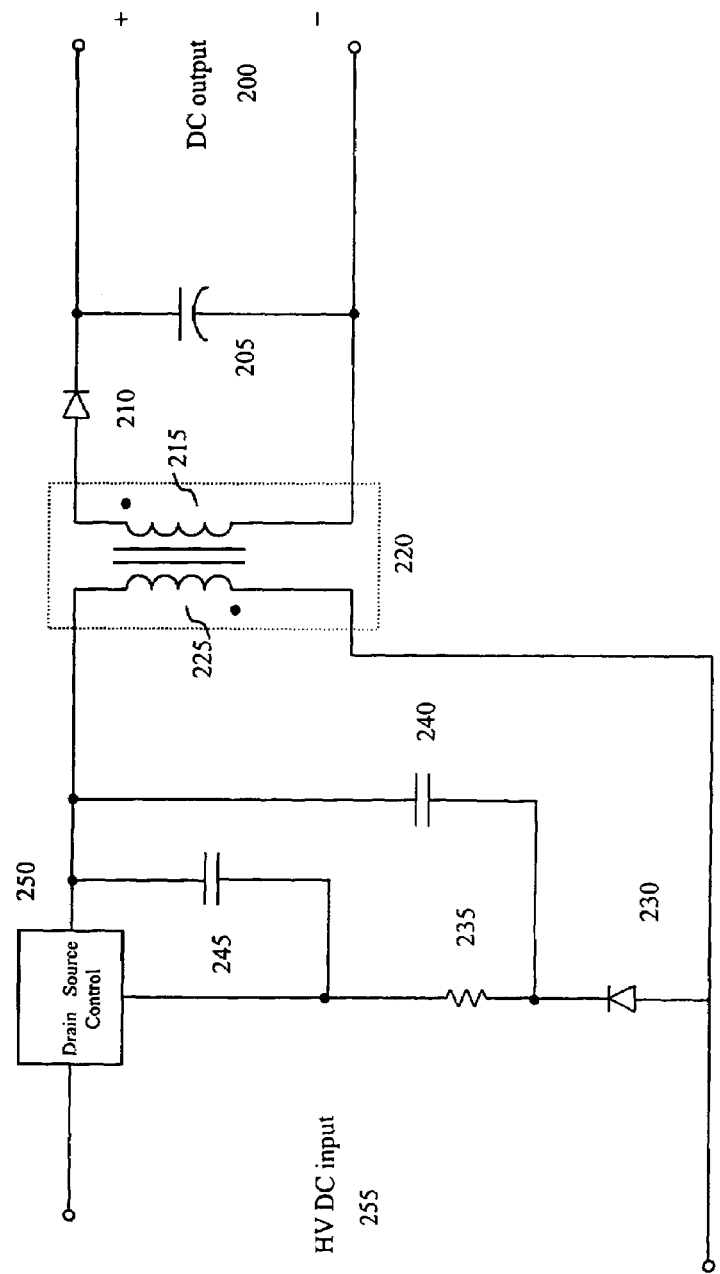
FIG. 3 shows one embodiment of a power supply that has an approximately constant voltage and constant current characteristic in accordance with the teachings of the present invention.

FIG. 3 shows one embodiment of a power supply that has an approximately constant voltage and constant current characteristic in accordance with the teachings of the present invention. An energy transfer element 220 is coupled between DC output 200 and HV DC input 255. In one embodiment, energy transfer element is a transformer including an input winding 225 and an output winding 215. Regulation circuit 250 is coupled between HV DC input 255 and energy transfer element 220 to regulate DC output 200. In the illustrated embodiment, feedback information responsive to DC output 200 is provided to the regulator 250 at its control pin. The current at the control pin is proportional to the voltage across resistor 235, which in turn is related to the output voltage at DC output 200.

In operation, the regulator circuit reduces the duty cycle of the power MOSFET when the voltage across resistor 235 increases above a threshold. In this section, the output is in approximately constant voltage mode. The regulator circuit reduces the current limit of the power MOSFET when the voltage across resistor 235 decreases below a threshold. The current limit is reduced as a function of the voltage across resistor 235 to keep the output load current constant. Thus, the load current is proportional to the current limit of the power MOSFET in regulator 250. By keeping the current limit invariant to line voltage, the output load current would remain constant at all line voltages.

Figure 4:
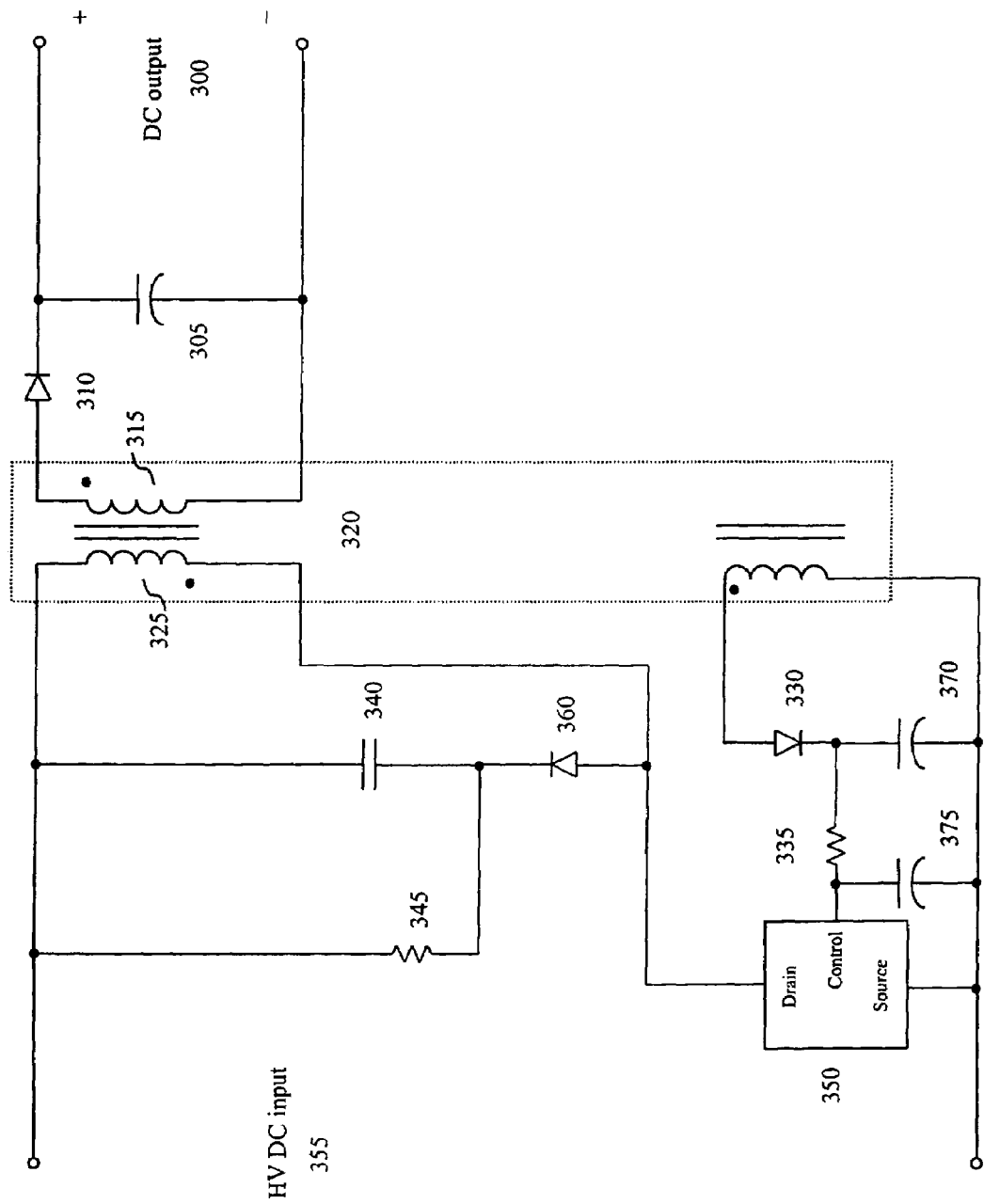
FIG. 4 shows one embodiment of a power supply that has an approximately constant voltage and constant current characteristic in accordance with the teachings of the present invention.

FIG. 4 shows one embodiment of a power supply that has an approximately constant voltage and constant current characteristic in accordance with the teachings of the present invention. The feedback information is provided to the regulator 350 at its control pin. The current at the control pin is proportional to the voltage across resistor 335, which in turn is related to the output voltage. The regulator circuit reduces the duty cycle of the power MOSFET when the voltage across resistor 335 increases above a threshold. In this section, the output is in approximately constant voltage mode. The regulator circuit reduces the current limit of the power MOSFET when the voltage across resistor 335 decreases below a threshold. The current limit is reduced as a function of the voltage across resistor 335 to keep the output load current approximately constant. Thus, the load current is proportional to the current limit of the power MOSFET in regulator 350. By keeping the current limit substantially constant with line voltage, the output load current would remain substantially constant at all line voltages.

Figure 5:
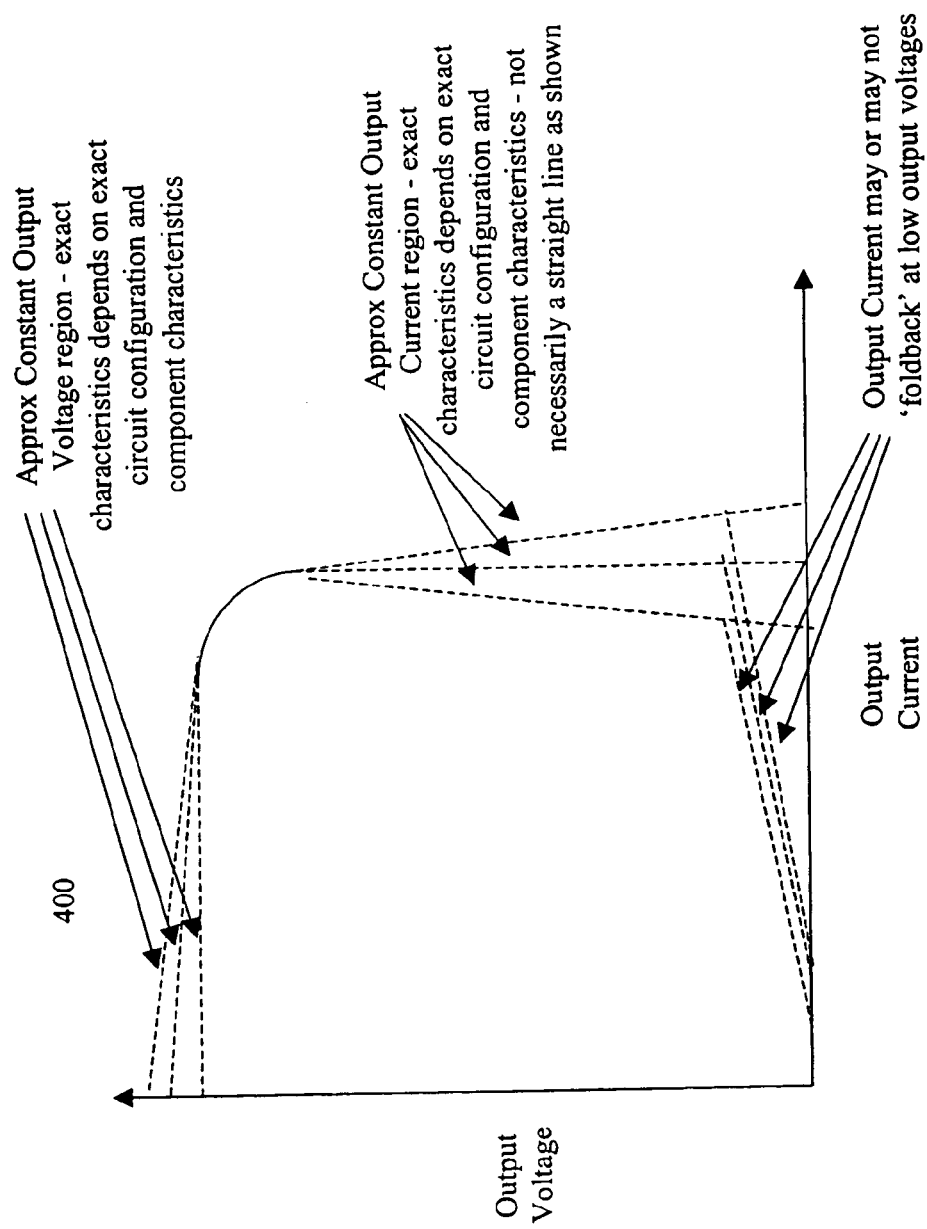
FIG. 5 is a diagram illustrating the typical relationship between the output current and output voltage of one embodiment of a power supply in accordance with the teachings of the present invention.

FIG. 5 is a diagram illustrating the typical relationship between the output current and output voltage of one embodiment of a power supply in accordance with the teachings of the present invention. As can be seen in curve 400, the power supply utilizing the invention exhibits an approximately constant output current and constant output voltage characteristic. That is, as output current increases, the output voltage remains approximately constant until the output current reaches an output current threshold. As the output current approaches the output current threshold, the output voltage decreases as the output current remains approximately constant over the drop in output voltage until a lower output voltage threshold is reached when the output current can reduce further as shown by the range of characteristics. It is appreciated that the constant output voltage and constant output current characteristics of the present invention are suitable for battery charger applications or the like.

In the foregoing detailed description, the method and apparatus of the present invention has been described with reference to specific exemplary embodiments thereof It will, however, be evident that various modifications and changes may be made thereto without departing from the broader spirit and scope of the present invention. The present specification and figures are accordingly to be regarded as illustrative rather than restrictive.

What is claimed is:

1. A circuit, comprising:
   a switch including first, second and third terminals, the first terminal coupled or decoupled to the second terminal in response to a control signal received at the third terminal; and
   voltage sense circuitry coupled to sense a voltage drop across the switch representative of a current in the switch during an on time of the switch, the voltage sense circuitry having a variable current limit threshold that increases between a first level and a second level during the on time of the switch, the control signal responsive to the variable current limit threshold to regulate a power supply with an output characteristic having an approximately constant output voltage below an output current threshold and an approximately constant output current below an output voltage threshold.

2. The circuit of claim 1 further comprising an oscillator to provide a sawtooth waveform, the variable current limit threshold varied in response to the sawtooth waveform.

3. The circuit of claim 2 further comprising a comparator coupled to the voltage sense circuitry to compare the current in the switch with the variable current limit threshold.

4. The circuit of claim 3 further comprising a latch to provide the control signal, the latch coupled to be reset in response to the comparator.

5. The power supply regulator of claim 1 wherein the switch comprises a metal oxide field effect transistor (MOSFET).

* * * * *